(12) United States Patent
Chien et al.

(10) Patent No.: US 11,942,396 B2
(45) Date of Patent: Mar. 26, 2024

(54) HETEROGENEOUS INTEGRATION SEMICONDUCTOR PACKAGE STRUCTURE

(71) Applicant: Industrial Technology Research Institute, Hsinchu (TW)

(72) Inventors: Heng-Chieh Chien, New Taipei (TW); Shu-Jung Yang, Tainan (TW); Yu-Min Lin, Hsinchu County (TW); Chih-Yao Wang, Hsinchu County (TW); Yu-Lin Chao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 184 days.

(21) Appl. No.: 17/564,219

(22) Filed: Dec. 29, 2021

(65) Prior Publication Data

US 2023/0170279 A1 Jun. 1, 2023

(30) Foreign Application Priority Data

Nov. 30, 2021 (TW) .................................. 110144569

(51) Int. Cl.
*H01L 23/427* (2006.01)
*H01L 23/00* (2006.01)
(Continued)

(52) U.S. Cl.
CPC .......... *H01L 23/427* (2013.01); *H01L 23/481* (2013.01); *H01L 23/49816* (2013.01);
(Continued)

(58) Field of Classification Search
CPC . H01L 23/427; H01L 23/34; H01L 23/49568; H01L 23/5389; H01L 2023/404; H01L 25/0655; H01S 5/02476
See application file for complete search history.

(56) References Cited

U.S. PATENT DOCUMENTS 7,002,247 B2 2/2006 Mok et al.
8,531,032 B2 9/2013 Yu et al.
(Continued)

FOREIGN PATENT DOCUMENTS

CN 101378096 3/2009
CN 108573936 A * 9/2018 ............. H01L 23/04
(Continued)

OTHER PUBLICATIONS

"Notice of Allowance of Taiwan Counterpart Application", dated Dec. 6, 2022, p. 1-p. 3.
(Continued)

*Primary Examiner* — Victor A Mandala
*Assistant Examiner* — Lawrence C Tynes, Jr.
(74) *Attorney, Agent, or Firm* — JCIPRNET

(57) ABSTRACT

A heterogeneous integration semiconductor package structure including a heat dissipation assembly, multiple chips, a package assembly, multiple connectors and a circuit substrate is provided. The heat dissipation assembly has a connection surface and includes a two-phase flow heat dissipation device and a first redistribution structure layer embedded in the connection surface. The chips are disposed on the connection surface of the heat dissipation assembly and electrically connected to the first redistribution structure layer. The package assembly surrounds the chips and includes a second redistribution structure layer disposed on a lower surface and multiple conductive vias electrically connected to the first redistribution structure layer and the second redistribution structure layer. The connectors are disposed on the package assembly and electrically connected to the second redistribution structure layer. The circuit substrate is electrically connected to the second redistribution structure layer of the package assembly through the connectors.

16 Claims, 13 Drawing Sheets

(51) Int. Cl.
  *H01L 23/48* (2006.01)
  *H01L 23/498* (2006.01)
  *H01L 25/065* (2023.01)

(52) U.S. Cl.
  CPC .. *H01L 23/49822* (2013.01); *H01L 23/49833* (2013.01); *H01L 23/49838* (2013.01); *H01L 24/16* (2013.01); *H01L 25/0655* (2013.01); *H01L 2224/16235* (2013.01)

(56) References Cited

U.S. PATENT DOCUMENTS

| | | | |
|---|---|---|---|
| 8,674,510 | B2 | 3/2014 | LaW et al. |
| 9,831,148 | B2* | 11/2017 | Yu .................. H01L 24/16 |
| 10,943,846 | B2 | 3/2021 | Wang et al. |
| 2014/0126150 | A1 | 5/2014 | Song et al. |
| 2014/0217610 | A1* | 8/2014 | Jeng .................. H01L 21/4857 257/774 |
| 2017/0062383 | A1* | 3/2017 | Yee .................. H01L 23/3675 |
| 2017/0263518 | A1* | 9/2017 | Yu .................. H01L 23/3128 |
| 2017/0301650 | A1* | 10/2017 | Yu .................. H01L 21/0217 |
| 2018/0315720 | A1* | 11/2018 | Liao .................. H01L 21/563 |
| 2019/0004573 | A1* | 1/2019 | Kulkarni .................. H01L 23/473 |
| 2019/0123020 | A1* | 4/2019 | Yu .................. H01L 24/83 |
| 2019/0326273 | A1* | 10/2019 | Bhagavat .................. H01L 25/18 |
| 2019/0385929 | A1* | 12/2019 | Ku .................. H01L 25/0655 |
| 2020/0161242 | A1* | 5/2020 | Lin .................. H01L 24/08 |
| 2020/0204067 | A1* | 6/2020 | Dabral .................. H01L 23/5227 |
| 2020/0373244 | A1 | 11/2020 | Kang et al. |
| 2021/0391283 | A1* | 12/2021 | Hsu .................. H01L 23/5389 |

FOREIGN PATENT DOCUMENTS

| | | |
|---|---|---|
| CN | 211879369 | 11/2020 |
| EP | 2806455 | 11/2014 |
| TW | 201740532 | 11/2017 |
| TW | 202114090 | 4/2021 |

OTHER PUBLICATIONS

Mengyao Wei, et al., "A Comprehensive Study of Silicon Micropillar Based Biporous Evaporator", Proceedings of the 3rd World Congress on Mechanical, Chemical, and Material Engineering (MCM'17), Jun. 8-10, 2017, pp. HTFF 123-1-HTFF 123-8.

Ki Wook Jung, et al., "Embedded cooling with 3D manifold for vehicle power electronics application: Single-phase thermal-fluid performance", International Journal of Heat and Mass Transfer, Nov. 13, 2018, pp. 1108-1119.

* cited by examiner

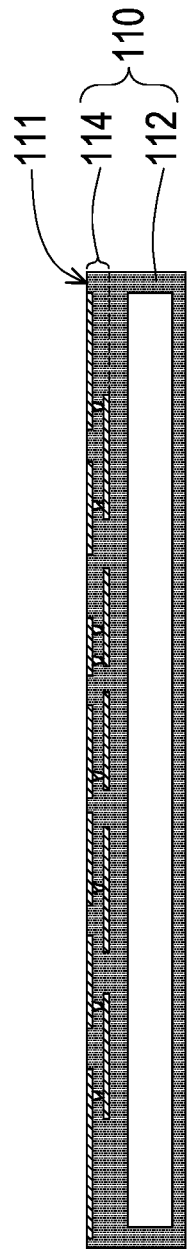
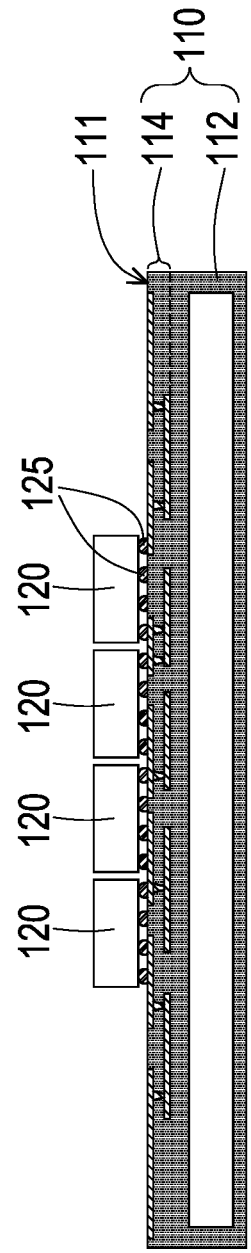
FIG. 2A
FIG. 2B

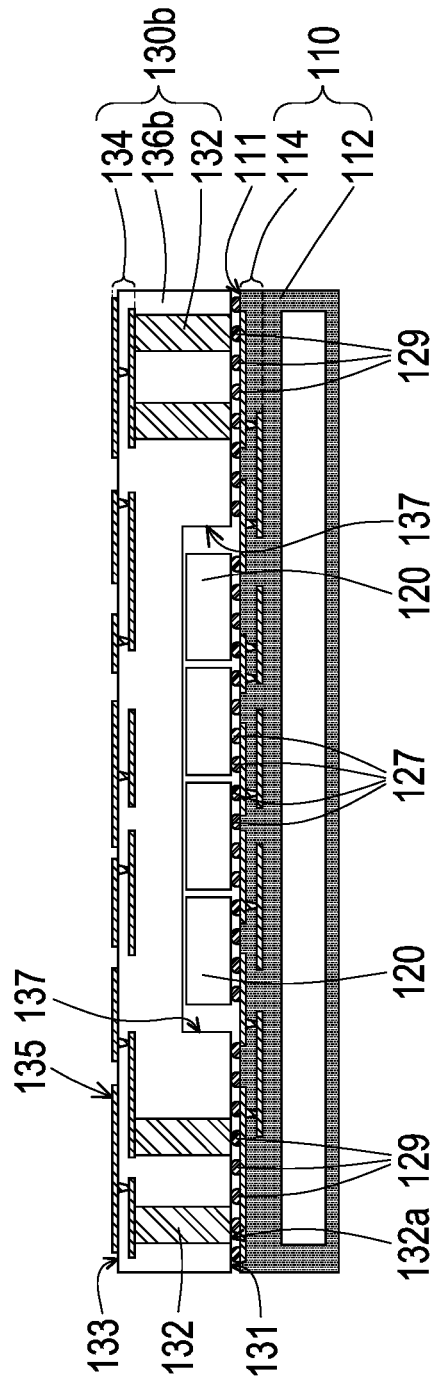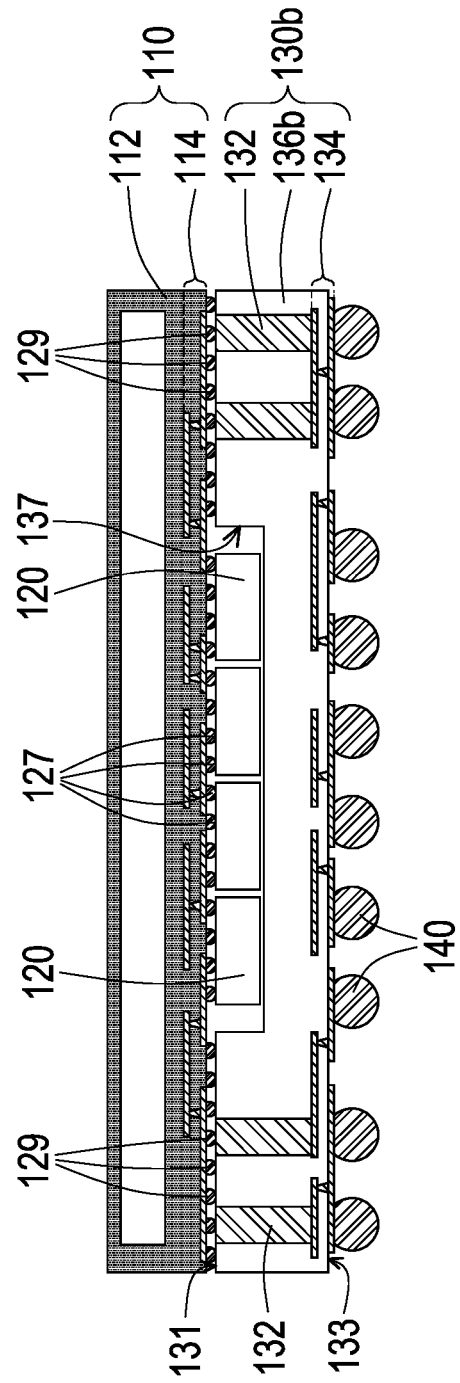

HETEROGENEOUS INTEGRATION SEMICONDUCTOR PACKAGE STRUCTURE

CROSS-REFERENCE TO RELATED APPLICATION

This application claims the priority benefit of Taiwan application serial no. 110144569, filed on Nov. 30, 2021. The entirety of the above-mentioned patent application is hereby incorporated by reference herein and made a part of this specification.

TECHNICAL FIELD

The disclosure relates to a package structure, and relates to a heterogeneous integration semiconductor package structure.

BACKGROUND

Along with advent of high computing power era of artificial intelligence (AI), high performance computing (HPC) heterogeneous integration package modules all encounter design requirements for high power density or heat dissipation of large area but high power consumption. In the current package structure, a chip is assembled on a redistribution structure layer in a manner that an active surface thereof faces downwards, an encapsulant seals the chip and covers a back surface of the chip, and the redistribution structure layer is electrically connected to a circuit substrate through solder balls. Therefore, under the current package structure, an internal thermal resistance is quite high, and heat conduction ability of the chip with the active surface facing downwards is insufficient, which obviously increases a temperature of the chip. In addition, when an external heat dissipation module is adopted, the external heat dissipation module is separated from the back surface of the chip by the encapsulant, so the heat generated by the chip cannot be evenly transferred to the external heat dissipation module, which also limits the heat dissipation performance of the external heat dissipation module.

SUMMARY

The disclosure provides a heterogeneous integration semiconductor package structure including a heat dissipation assembly, a plurality of chips, a package assembly, a plurality of connectors, and a circuit substrate. The heat dissipation assembly has a connection surface and includes a two-phase flow heat dissipation device and a first redistribution structure layer embedded in the connection surface. The chips are disposed on the connection surface of the heat dissipation assembly and electrically connected to the first redistribution structure layer. The package assembly is disposed on the connection surface of the heat dissipation assembly and surrounds the chips. The package assembly has an upper surface adjacent to the connection surface and a lower surface opposite to the upper surface and includes a second redistribution structure layer disposed on the lower surface and a plurality of conductive vias electrically connected to the first redistribution structure layer and the second redistribution structure layer. The connectors are disposed on the package assembly and electrically connected to the second redistribution structure layer. The circuit substrate is electrically connected to the second redistribution structure layer of the package assembly through the connectors.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 2A to FIG. 2D are schematic cross-sectional views showing partial steps of a manufacturing method of the heterogeneous integration semiconductor package structure of FIG. 1.

FIG. 7A to FIG. 7B are schematic cross-sectional views showing partial steps of a manufacturing method of the heterogeneous integration semiconductor package structure of FIG. 6.

DESCRIPTION OF THE EMBODIMENTS

Figure 1:
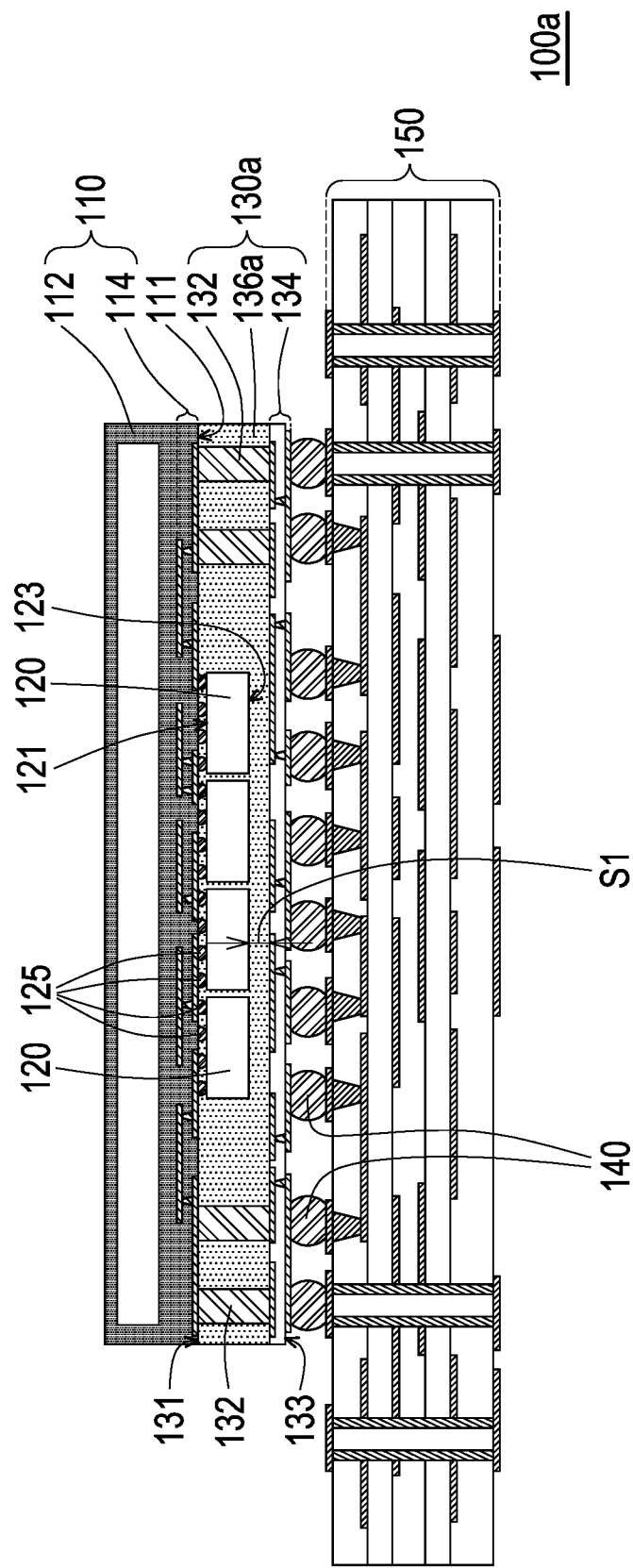
FIG. 1 is a schematic cross-sectional view of a heterogeneous integration semiconductor package structure according to an embodiment of the disclosure.

FIG. 1 is a schematic cross-sectional view of a heterogeneous integration semiconductor package structure according to an embodiment of the disclosure. FIG. 2A to FIG. 2D are schematic cross-sectional views showing partial steps of a manufacturing method of the heterogeneous integration semiconductor package structure of FIG. 1.

The disclosure spirit of the heterogeneous integration semiconductor package structure of the disclosure is also applicable to general semiconductor package structure design. Referring to FIG. 1, in the embodiment, a heterogeneous integration semiconductor package structure 100a includes a heat dissipation assembly 110, a plurality of chips 120, a package assembly 130a, a plurality of connectors 140 and a circuit substrate 150. The heat dissipation assembly 110 has a connection surface 111 and includes a two-phase flow heat dissipation device 112 and a first redistribution structure layer 114 embedded in the connection surface 111. The chips 120 are disposed on the connection surface 111 of the heat dissipation assembly 110 and are electrically connected to the first redistribution structure layer 114. The package assembly 130a is disposed on the connection surface 111 of the heat dissipation assembly 110 and surrounds the chips 120. The package assembly 130a has an upper surface 131 adjacent to the connection surface 111 and a lower surface 133 opposite to the upper surface 111, and includes a second redistribution structure layer 134 disposed on the lower surface 133 and a plurality of conductive vias 132 electrically connecting the first redistribution structure layer 114 and the second redistribution structure layer 134. The connectors 140 are disposed on the package assembly 130a and electrically connected to the second redistribution structure layer 134. The circuit substrate 150 is electrically connected to the second redistribution structure layer 134 of the package assembly 130a through the connectors 140.

The two-phase flow heat dissipation device 112 of the heat dissipation assembly 110 of the embodiment is, for example, a vapor chamber (VC), a pulsating heat pipe (PHP), a loop heat pipe (LHP), or an active two-phase flow micro-channel device. The chips 120 are connected to the heat dissipation assembly 110 having the two-phase flow heat dissipation device 112, so that an efficient temperature uniformity thermal diffusion mechanism may be used to improve heat dissipation performance of an external heat dissipation module. Furthermore, each chip 120 of the embodiment has an active surface 121 and a back surface 123 opposite to each other, where the active surface 121 of the chip 120 faces the connection surface 111 of the heat dissipation assembly 110. There is a gap S1 between the back surface 123 of each chip 120 and the second redistribution structure layer 134. As shown in FIG. 1, the heterogeneous integration semiconductor package structure 100a of the embodiment further includes a plurality of solder balls 125, where the solder balls 125 are disposed between the chips 120 and the first redistribution structure layer 114, and the chips 120 are electrically connected to the first redistribution structure layer 114 through the solder balls 125.

In addition, the package assembly 130a of the embodiment further includes a package component 136a, where the package component 136a wraps the periphery of the chips 120 and the periphery of the conductive vias 132, and connects the first redistribution structure layer 114 and the second redistribution structure layer 134, and is filled between the solder balls 125 and the chips 120. A material of the package component 136a is, for example, a polymer material, such as epoxy resin, and the conductive vias 132 are, for example, through molding vias (TMV), but the disclosure is not limited thereto. In an embodiment, an edge of the heat dissipation assembly 110 may be aligned with or slightly larger or smaller than an edge of the package assembly 130a. The connectors 140 are, for example, a plurality of solder balls, but the disclosure is not limited thereto.

In terms of manufacturing of the heterogeneous integration semiconductor package structure 100a, first, referring to FIG. 2A, the heat dissipation assembly 110 is provided, where the heat dissipation assembly 110 includes the two-phase flow heat dissipation device 112 and the first redistribution structure layer 114 embedded in the connection surface 111. In other words, the heat dissipation assembly 110 of the embodiment has a design of a circuit structure (i.e. the first redistribution structure layer 114).

Then, referring to FIG. 2B, the chips 120 are disposed on the connection surface 111 of the heat dissipation assembly 110, where the chips 120 are electrically connected to the first redistribution structure layer 114 of the heat dissipation assembly 110 through the solder balls 125. A distribution area of the first redistribution structure layer 114 is larger than a configuration area of the chips 120, so that the first redistribution structure layer 114 may be regarded as a fan-out circuit.

Figure 2C:
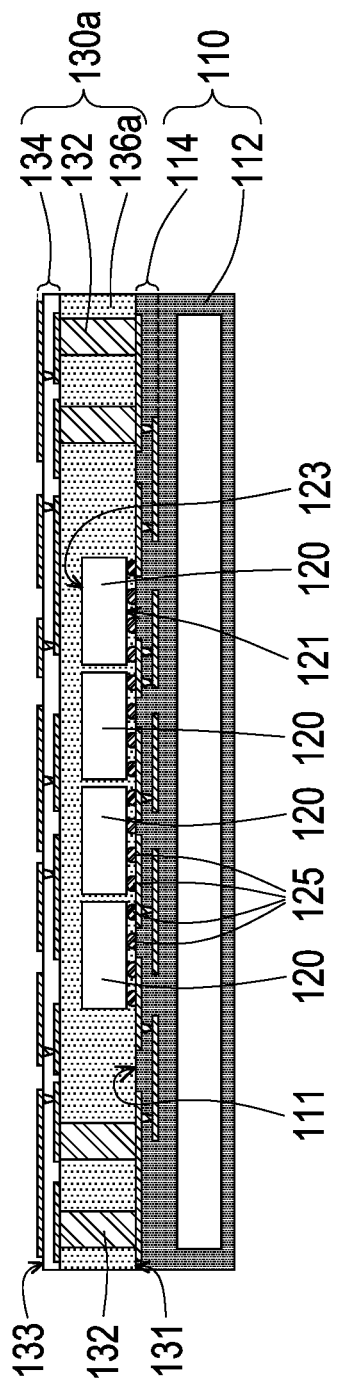

Then, referring to FIG. 2C, the package assembly 130a is formed on the connection surface 111 of the chips 120 and the heat dissipation assembly 110, where the package assembly 130a includes the conductive vias 132, the second redistribution structure layer 134, and the package component 136a. The conductive vias 132 are located between the first redistribution structure layer 114 and the second redistribution structure layer 134, and the conductive vias 132 electrically connect the first redistribution structure layer 114 and the second redistribution structure layer 134. The second redistribution structure layer 134 is disposed on the lower surface 133 of the package assembly 130a, and is structurally and electrically connected to the conductive vias 132. The package component 136a wraps the periphery of the chips 120 and the periphery of the conductive vias 132, connects the first redistribution structure layer 114 and the second redistribution structure layer 134, and is filled between the solder balls 125 and the chips 120. A material of the package component 136a is, for example, a polymer material, and the conductive vias 132 are, for example, through molding vias (TMV), but the disclosure is not limited thereto.

Figure 2D:
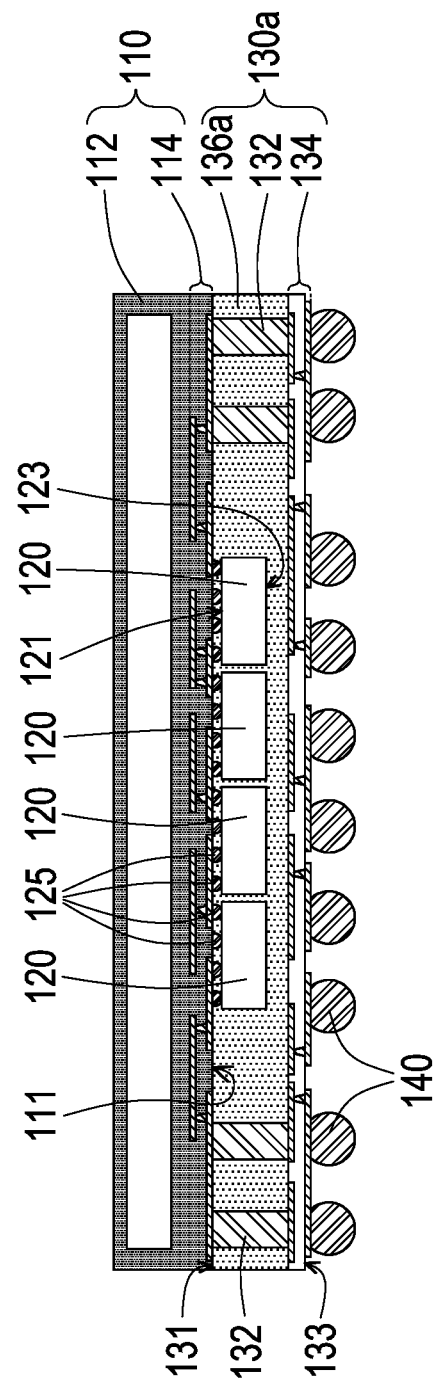

Then, referring to FIG. 2D, the above-mentioned structure of FIG. 2C is overturned, and the connectors 140 are formed on the lower surface 133 of the package assembly 130a, where the connectors 140 are located on the second redistribution structure layer 134, and the connectors 140 and the second redistribution structure layer 134 are electrically connected. The connectors 140 are, for example, solder balls.

Finally, referring to FIG. 1, the circuit substrate 150 is provided, where the circuit substrate 150 is electrically connected to the second redistribution structure layer 134 through the connectors 140. So far, manufacturing of the heterogeneous integration semiconductor package structure 100a is completed.

In brief, in the design of the heterogeneous integration semiconductor package structure 100a of the embodiment, the chips 120 are connected to the heat dissipation assembly 110 with the two-phase flow heat dissipation device 112 in a manner that the active surface 121 faces upwards, so that the efficient temperature uniformity thermal diffusion mechanism may be used to improve the heat dissipation performance of the external heat dissipation module.

It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 3:
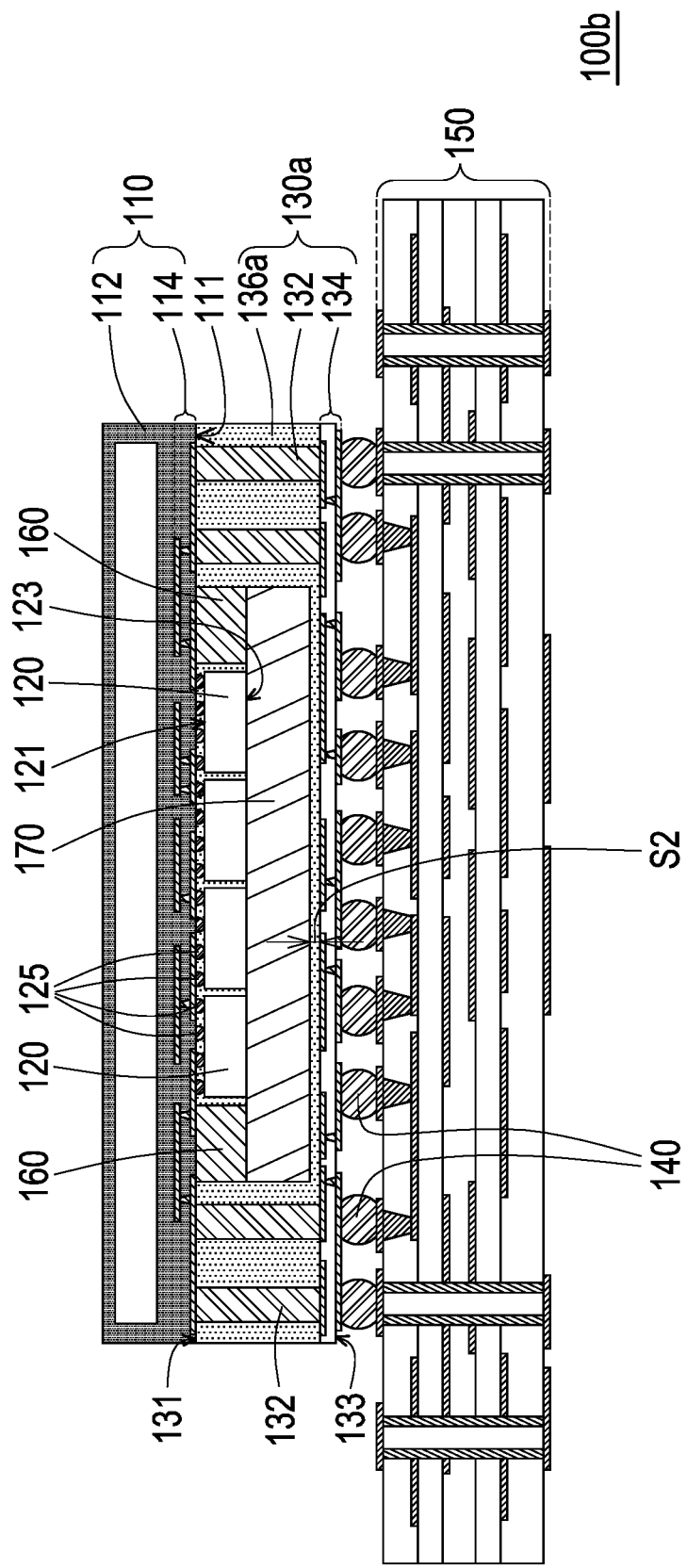
FIG. 3 is a schematic cross-sectional view of a heterogeneous integration semiconductor package structure according to another embodiment of the disclosure.

FIG. 3 is a schematic cross-sectional view of a heterogeneous integration semiconductor package structure according to another embodiment of the disclosure. FIG. 4A to FIG. 4D are schematic cross-sectional views showing partial steps of a manufacturing method of the heterogeneous integration semiconductor package structure of FIG. 3.

Referring to FIG. 1 and FIG. 3 first, a heterogeneous integration semiconductor package structure 100b of the embodiment is similar to the heterogeneous integration semiconductor package structure 100a of FIG. 1, and a difference there between is that in the embodiment, the heterogeneous integration semiconductor package structure 100b further includes a plurality of heat conduction blocks 160 and a heat conduction device 170. The heat conduction blocks 160 are disposed on the connection surface 111 of the heat dissipation assembly 110, surround the periphery of the chips 120 and the periphery of the solder balls 125, and are connected to the first redistribution structure layer 114. A material of the heat conduction blocks 160 is, for example, a highly thermal conductivity material, which may be connected to the first redistribution structure layer 114 through bonding, soldering or solder balls. In an embodiment, a temperature sensing circuit may be fabricated on the heat conduction blocks 160 to measure a temperature. The heat conduction device 170 is in contact with the heat conduction blocks 160 and the back surfaces 123 of the chips 120, and there is a gap S2 between the heat conduction device 170 and the second redistribution structure layer 134. The chips 120 and the heat conduction blocks 160 are located between the heat conduction device 170 and the heat dissipation assembly 110, and the package component 136a further covers the periphery of the heat conduction blocks 160 and the periphery of the heat conduction device 170. Here, the heat conduction device 170 is, for example, a silicon substrate, a graphite sheet, a metal plate, a vapor chamber, a pulsating heat pipe, or a loop heat pipe.

Figure 4A:
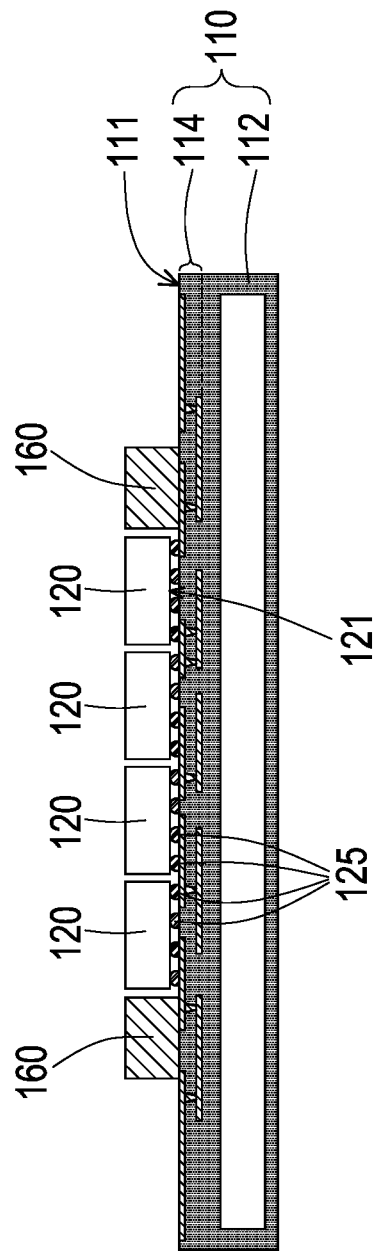
FIG. 4A to FIG. 4D are schematic cross-sectional views showing partial steps of a manufacturing method of the heterogeneous integration semiconductor package structure of FIG. 3.

In terms of manufacturing, the manufacturing method of the heterogeneous integration semiconductor package structure 100b of the embodiment is similar to the above-mentioned manufacturing method of the heterogeneous integration semiconductor package structure 100a, and a difference there between is that after the step of FIG. 2, i.e. after the chips 120 are disposed on the connection surface 111 of the heat dissipation assembly 110, referring to FIG. 4A, the heat conduction blocks 160 are formed on the connection surface 111 of the heat dissipation assembly 110, where the heat conduction blocks 160 surround the periphery of the chips 120 and the periphery of the solder balls 125, and are connected to the first redistribution structure layer 114.

Figure 4B:
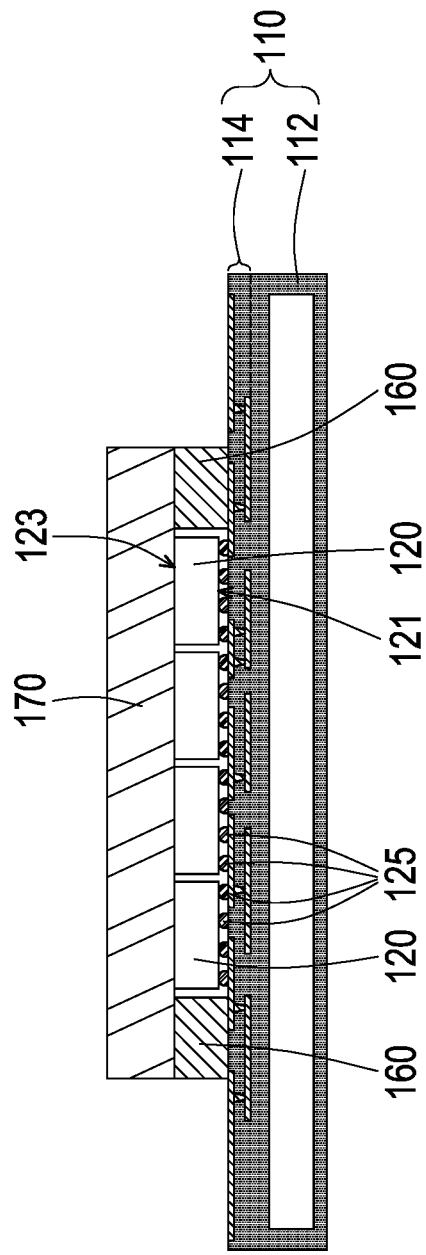

Then, referring to FIG. 4B, the heat conduction device 170 is provided to be in contact with the heat conduction blocks 160 and the back surfaces 123 of the chips 120, where the chips 120 and the heat conduction blocks 160 are located between the heat conduction device 170 and the heat dissipation assembly 110.

Figure 4C:
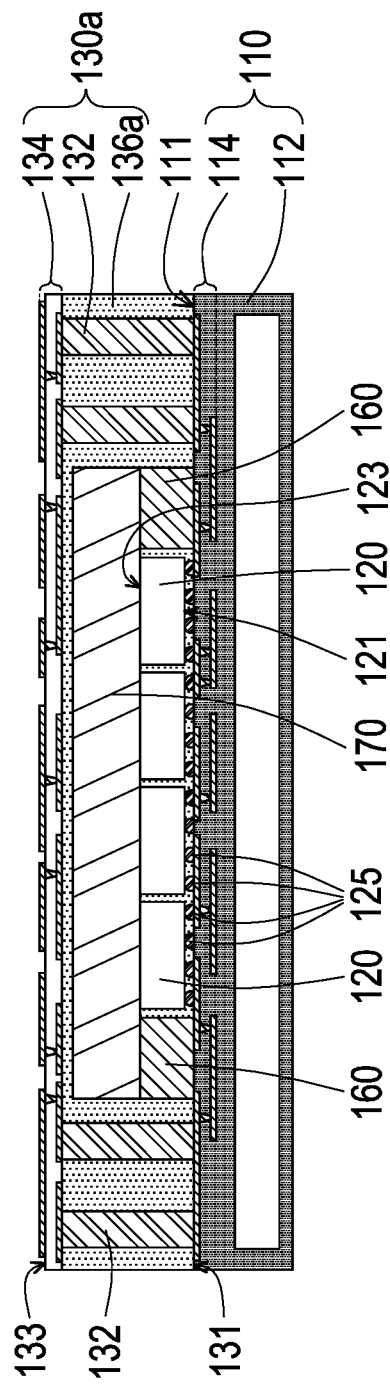

Then, referring to FIG. 4C, the package assembly 130a is formed on the connection surface 111 of the chips 120 and the heat dissipation assembly 110, where the package assembly 130a includes the conductive vias 132, the second redistribution structure layer 134, and the package component 136a. The conductive vias 132 electrically connect the first redistribution structure layer 114 and the second redistribution structure layer 134. The second redistribution structure layer 134 is disposed on the lower surface 133 of the package assembly 130a. The package component 136a wraps the periphery of the chips 120, the periphery of the conductive vias 132, the periphery of the heat conduction blocks 160, and the periphery of the heat conduction device 170, and connects the first redistribution structure layer 114 and the second redistribution structure layer 134, and is filled between the solder balls 125 and the chips 120.

Figure 4D:
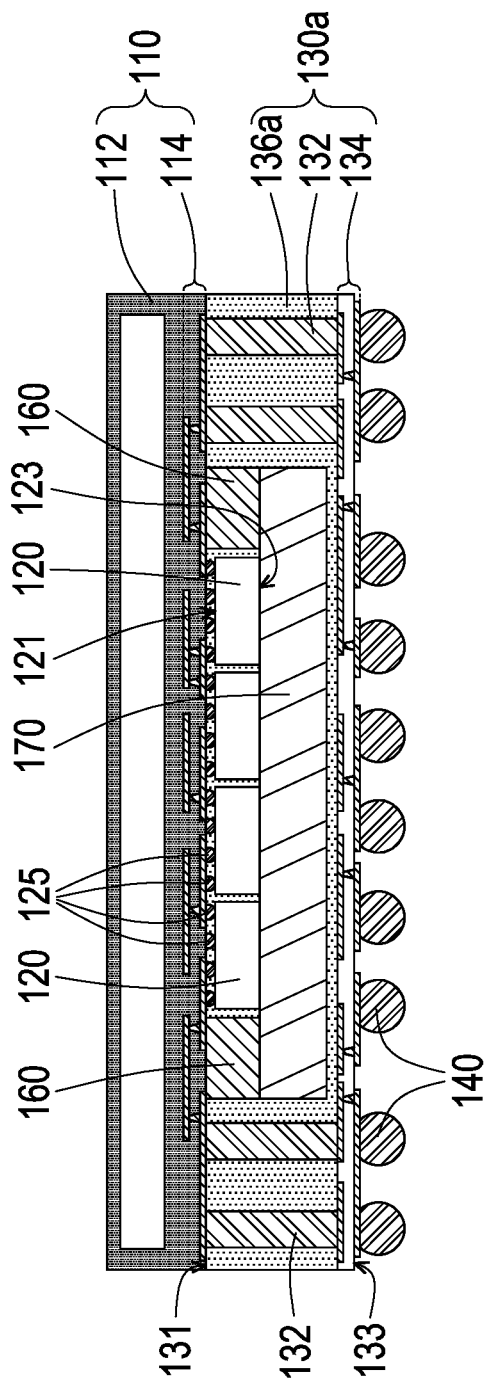

Then, referring to FIG. 4D, the above-mentioned structure of FIG. 4C is overturned, and the connectors 140 are formed on the second redistribution structure layer 134 of the package assembly 130a, where the connectors 140 are electrically connected to the second redistribution structure layer 134.

Finally, referring to FIG. 3, the circuit substrate 150 is provided, where the circuit substrate 150 is electrically connected to the second redistribution structure layer 134 through the connectors 140. So far, manufacturing of the heterogeneous integration semiconductor package structure 100b is completed.

In brief, in the design of the heterogeneous integration semiconductor package structure 100b of the embodiment, the chips 120 are connected to the heat dissipation assembly 110 with the two-phase flow heat dissipation device 112 in a manner that the active surface 121 faces upwards, so that the efficient temperature uniformity thermal diffusion mechanism may be used to improve the heat dissipation performance of the external heat dissipation module. Moreover, since the heat conduction blocks 160 are provided, the heat conduction structure may be used to enhance the heat dissipation of the external heat dissipation module. In addition, since the heat conducting device 170 is provided, the efficient temperature uniformity thermal diffusion mechanism may be used to effectively reduce an internal thermal resistance of the heterogeneous integration semiconductor package structure 100b.

Figure 5:
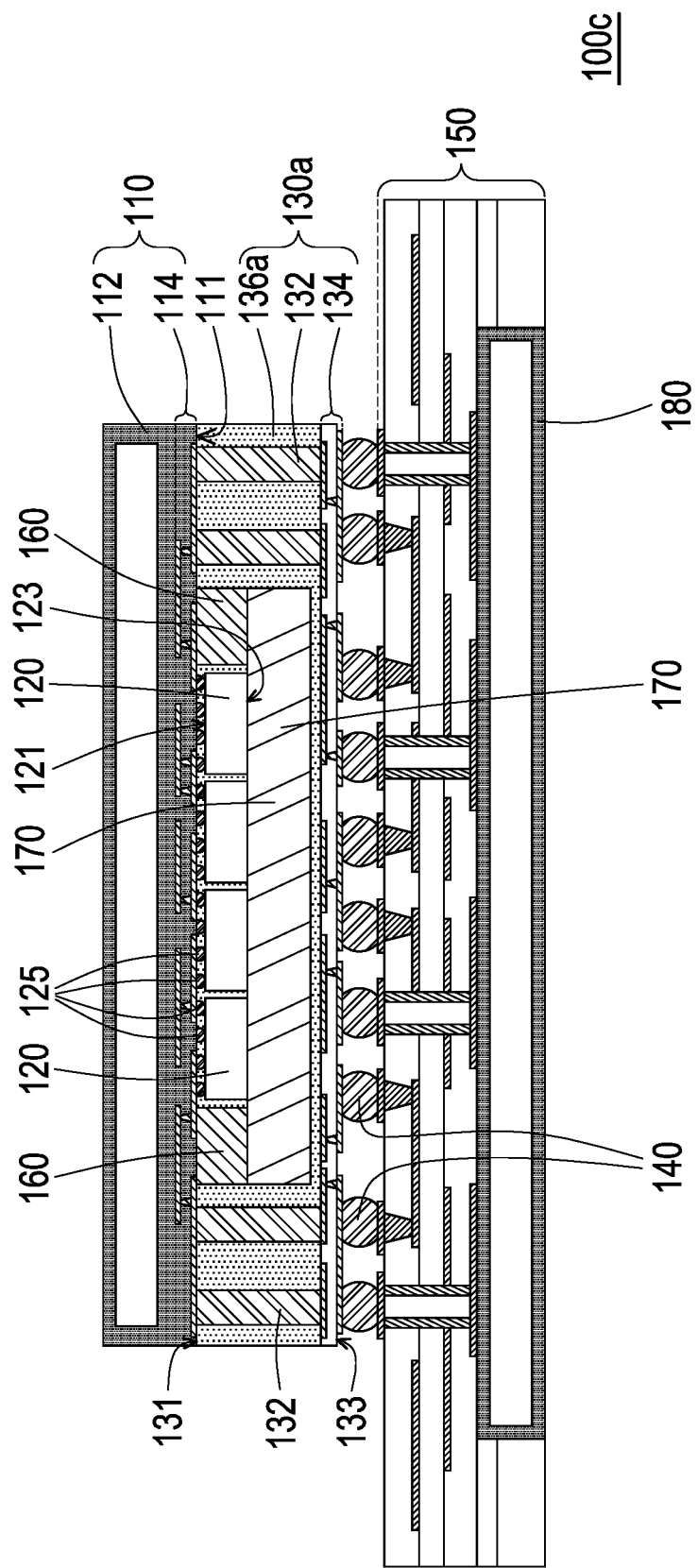
FIG. 5 is a schematic cross-sectional view of a heterogeneous integration semiconductor package structure according to another embodiment of the disclosure.

FIG. 5 is a schematic cross-sectional view of a heterogeneous integration semiconductor package structure according to another embodiment of the disclosure. Referring to FIG. 3 and FIG. 5 at the same time, a heterogeneous integration semiconductor package structure 100c of the embodiment is similar to the heterogeneous integration semiconductor package structure 100b of FIG. 3, and a difference there between is that in the embodiment, the heterogeneous integration semiconductor package structure 100c further includes a heat conduction assembly 180 embedded in the circuit substrate 150. The heat conduction assembly 180 is, for example, a vapor chamber, a pulsating heat pipe, or a loop heat pipe or a liquid-cooled micro flow channel.

Since the heterogeneous integration semiconductor package structure 100c of the embodiment is provided with the heat conduction device 170 in the package assembly 130a and provided with the heat conduction assembly 180 in the circuit substrate 150, the efficient temperature uniformity thermal diffusion mechanism may be used to effectively reduce the internal thermal resistance of the heterogeneous integration semiconductor package structure 100c, thereby improving the heat dissipation effect of the heterogeneous integration semiconductor package structure 100c.

Figure 6:
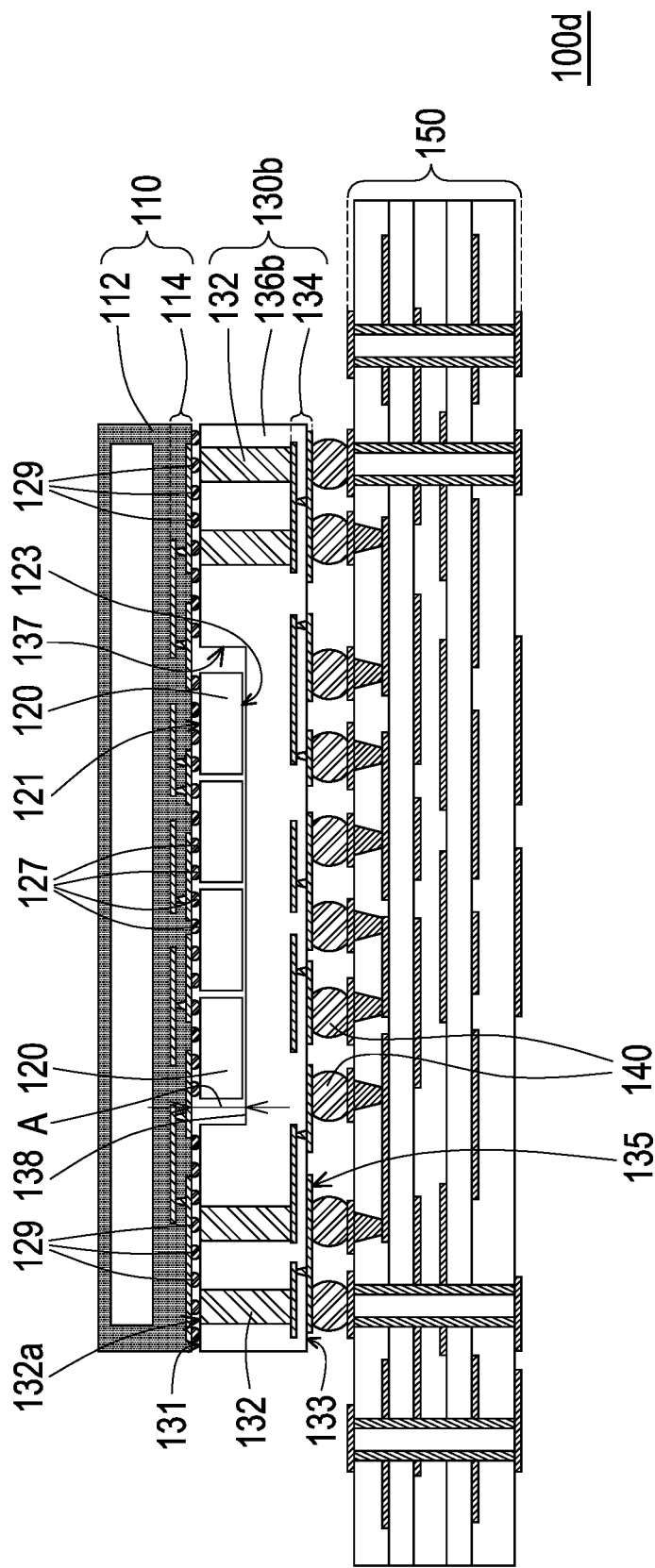
FIG. 6 is a schematic cross-sectional view of a heterogeneous integration semiconductor package structure according to another embodiment of the disclosure.

FIG. 6 is a schematic cross-sectional view of a heterogeneous integration semiconductor package structure according to another embodiment of the disclosure. FIG. 7A to FIG. 7B are schematic cross-sectional views showing partial steps of a manufacturing method of the heterogeneous integration semiconductor package structure of FIG. 6. Referring to FIG. 1 and FIG. 6 first, a heterogeneous integration semiconductor package structure 100d of the embodiment is similar to the heterogeneous integration semiconductor package structure 100a of FIG. 1, and a difference there between is that in the embodiment, a material and a structure design of a package assembly 130b are different from the material and structure design of the package assembly 130a described above.

In detail, in the embodiment, in addition to the conductive vias 132 and the second redistribution structure layer 134, the package assembly 130b further includes a cover 136b, where the cover 136b has a groove 137, and the chips 120 are located in the groove 137. As shown in FIG. 6, there is an air gap A between the connection surface 111 of the heat dissipation assembly 110 and a bottom surface 138 of the groove 137. In one embodiment, the chips 120 and the bottom surface 138 of the groove 137 have a gap there between, and the gap can be filled with a thermal interface material. In another embodiment, the chips 120 may also directly contact the bottom surface 138 of the groove 137. The conductive vias 132 and the second redistribution structure layer 134 are embedded in the cover 136b, and one end 132a of each conductive via 132 and a surface 135 of the second redistribution structure layer 134 are exposed outside the cover 136b. A material of the cover 136b is, for example, silicon, and the conductive vias 132 are, for example, a plurality of through silicon vias (TSV).

In addition, the heterogeneous integration semiconductor package structure 100d of the embodiment further includes a plurality of first solder balls 127 and a plurality of second solder balls 129. The first solder balls 127 are disposed between the chips 120 and the first redistribution structure layer 114, where the chips 120 are electrically connected to the first redistribution structure layer 114 through the first solder balls 127. The second solder balls 129 are disposed between the upper surface 131 of the package assembly 130b and the first redistribution structure layer 114. The conductive vias 132 are electrically connected to the first redistribution structure layer 114 through the second solder balls 129.

In terms of manufacturing, a manufacturing method of the heterogeneous integration semiconductor package structure 100d of the embodiment is similar to the above-mentioned manufacturing method of the heterogeneous integration semiconductor package structure 100a. After the step of FIG. 2B is completed, i.e., after the chips 120 are placed on the connection surface 111 of the heat dissipation assembly 110, referring to FIG. 7A, the package assembly 130b is provided on the chips 120 and the connection surface 111 of the heat dissipation assembly 110, where the package assembly 130b includes the conductive vias 132, the second redistribution structure layer 134 and the cover 136b. The cover 136b has the groove 137, and the chips are located in the groove 137. The conductive vias 132 and the second redistribution structure layer 134 are embedded in the cover 136b, and one end 132a of each conductive via 132 and the surface 135 of the second redistribution structure layer 134 are exposed outside the cover 136b.

Then, referring to FIG. 7A again, the first solder balls 127 and the second solder balls 129 are formed. The first solder balls 127 are formed between the chips 120 and the first redistribution structure layer 114, where the chips 120 are electrically connected to the first redistribution structure layer 114 through the first solder balls 127. The second solder balls 129 are formed between the upper surface 131 of the package assembly 130b and the first redistribution structure layer 114. The conductive vias 132 are electrically connected to the first redistribution structure layer 114 through the second solder balls 129.

Thereafter, referring to FIG. 7B, the structure of FIG. 7A is overturned, and the connectors 140 are formed on the second redistribution structure layer 134 of the package assembly 130b, where the connectors 140 are electrically connected to the second redistribution structure layer 134.

Finally, referring to FIG. 6, the circuit substrate 150 is provided, where the circuit substrate 150 is electrically connected to the second redistribution structure layer 134 through the connectors 140. So far, manufacturing of the heterogeneous integration semiconductor package structure 100d is completed.

In brief, in the design of the heterogeneous integration semiconductor package structure 100d of the embodiment, the chips 120 are connected to the heat dissipation assembly 110 with the two-phase flow heat dissipation device 112 in a manner that the active surface 121 faces upwards, and through direct contact with the silicon cover 136b (which has better heat conduction characteristics than conventional molded polymer materials), the internal thermal resistance of the heterogeneous integration semiconductor package structure 100d may be effectively reduced, so that the efficient temperature uniformity thermal diffusion mechanism may be used to improve the heat dissipation performance of the external heat dissipation module.

Figure 8:
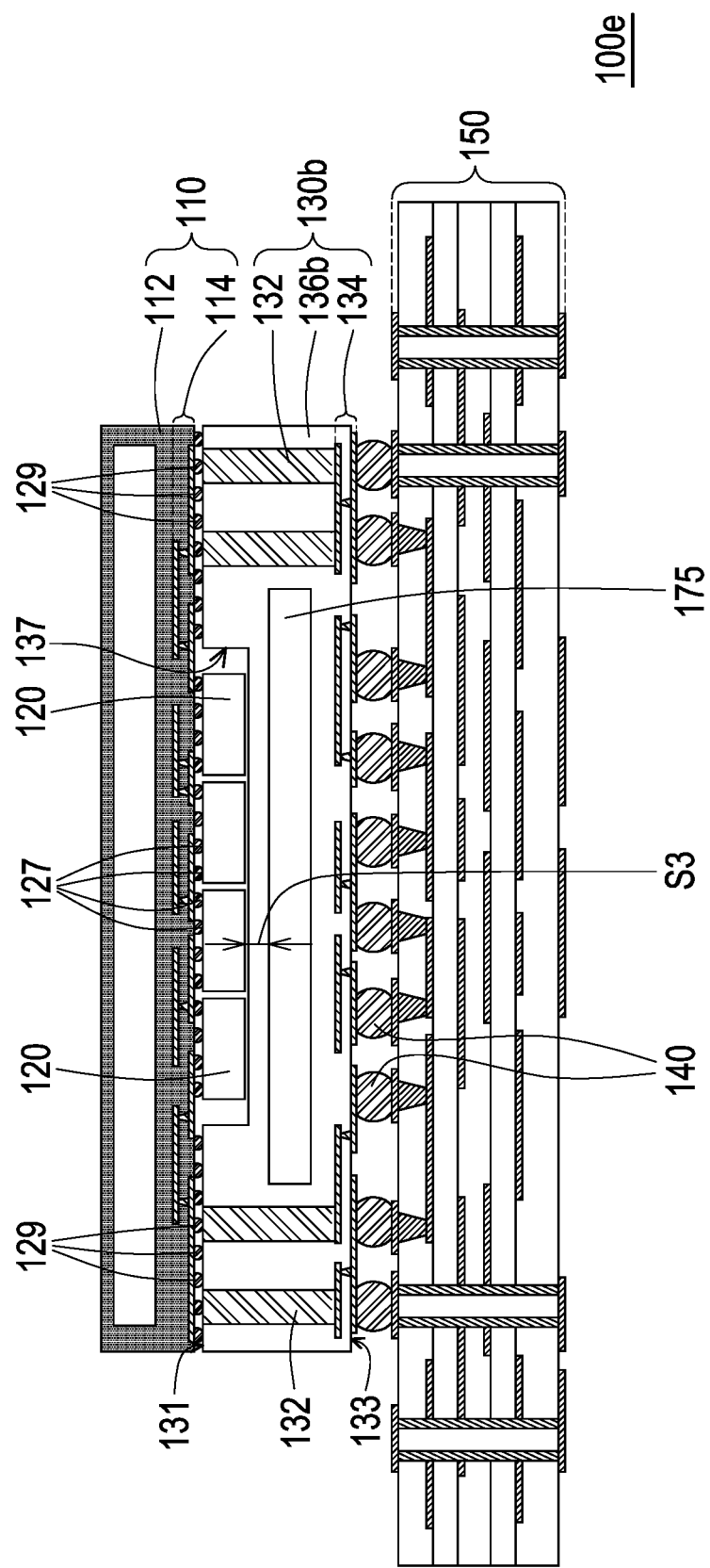
FIG. 8 is a schematic cross-sectional view of a heterogeneous integration semiconductor package structure according to another embodiment of the disclosure.
Figure 9A:
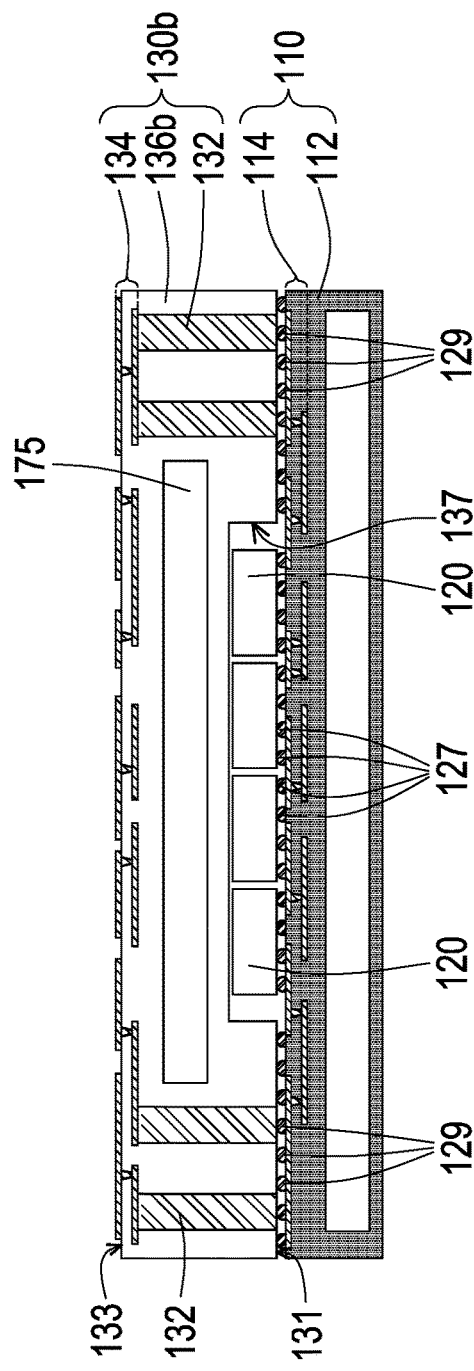
FIG. 9A to FIG. 9B are schematic cross-sectional views showing partial steps of a manufacturing method of the heterogeneous integration semiconductor package structure of FIG. 8.
Figure 9B:
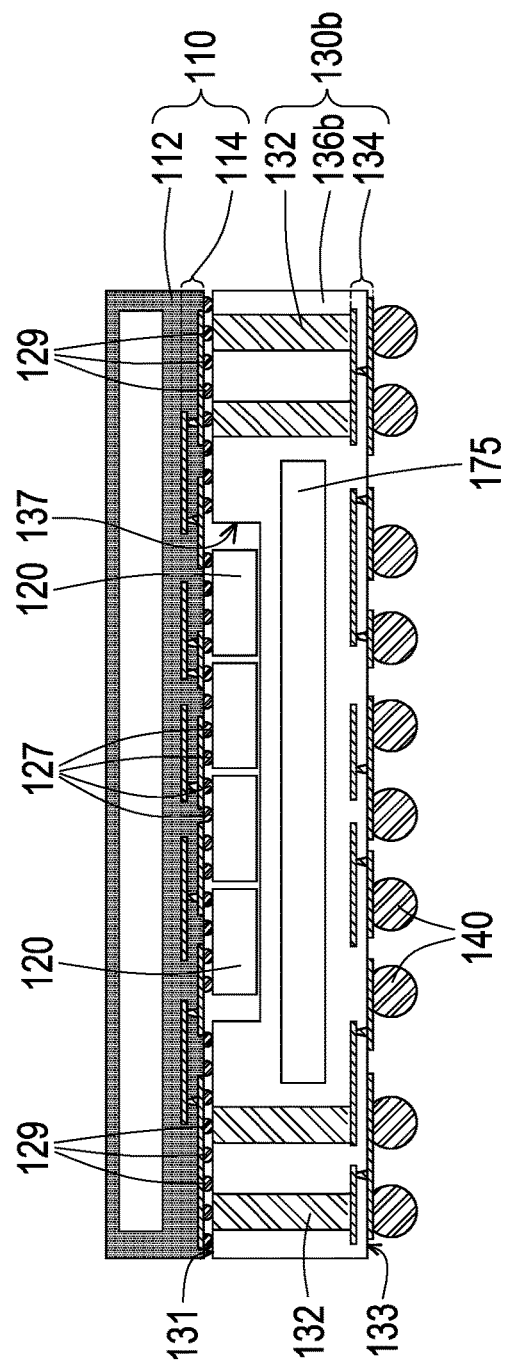

FIG. 8 is a schematic cross-sectional view of a heterogeneous integration semiconductor package structure according to another embodiment of the disclosure. FIG. 9A to FIG. 9B are schematic cross-sectional views showing partial steps of a manufacturing method of the heterogeneous integration semiconductor package structure of FIG. 8. Referring to FIG. 6 and FIG. 8, a heterogeneous integration semiconductor package structure 100e of the embodiment is similar to the heterogeneous integration semiconductor package structure 100d of FIG. 6, a difference there between is that in the embodiment, the heterogeneous integration semiconductor package structure 100e further includes a heat conduction device 175, which is embedded in the cover 136b of the package assembly 130b and is arranged corresponding to the chips 120, where there is a gap S3 between the heat conduction device 175 and the chips 120. The heat conduction device 175 is, for example, a vapor chamber, a pulsating heat pipe or a loop heat pipe.

In terms of manufacturing, the manufacturing method of the heterogeneous integration semiconductor package structure 100e of the embodiment is similar to the above-mentioned manufacturing method of the heterogeneous integration semiconductor package structure 100d, and a difference there between is that while the step of FIG. 7A is executed, i.e., while providing the package assembly 130b on the connection surface 111 of the chips 120 and the heat dissipation assembly 110, referring to FIG. 9, the heat conduction device 175 is embedded in the cover 136b, where the heat conduction device 175 is disposed corresponding to the chips 120.

Then, referring to FIG. 9A again, the first solder balls 127 and the second solder balls 129 are formed. The first solder balls 127 are formed between the chips 120 and the first redistribution structure layer 114, where the chips 120 are electrically connected to the first redistribution structure layer 114 through the first solder balls 127. The second solder balls 129 are formed between the upper surface 131 of the package assembly 130b and the first redistribution structure layer 114. The conductive vias 132 are electrically connected to the first redistribution structure layer 114 through the second solder balls 129.

Then, referring to FIG. 9B, the above-mentioned structure of FIG. 9B is overturned, and the connectors 140 are formed on the second redistribution structure layer 134 of the package assembly 130b, where the connectors 140 are electrically connected to the second redistribution structure layer 134.

Finally, referring to FIG. 8, the circuit substrate 150 is provided, where the circuit substrate 150 is electrically connected to the second redistribution structure layer 134 through the connectors 140. So far, manufacturing of the heterogeneous integration semiconductor package structure 100e is completed.

In brief, in the design of the heterogeneous integration semiconductor package structure 100e of the embodiment, the chips 120 are connected to the heat dissipation assembly 110 with the two-phase flow heat dissipation device 112 in the manner that the active surface 121 faces upwards, so that the efficient temperature uniformity thermal diffusion mechanism may be used to improve the heat dissipation performance of the external heat dissipation module. In addition, in the heterogeneous integration semiconductor package structure 100e, since the heat conduction device 175 is embedded in the cover 136b of the package assembly 130b, the efficient temperature uniformity thermal diffusion mechanism may be used to effectively reduce the internal thermal resistance of the heterogeneous integration semiconductor package structure 100e.

Figure 10:
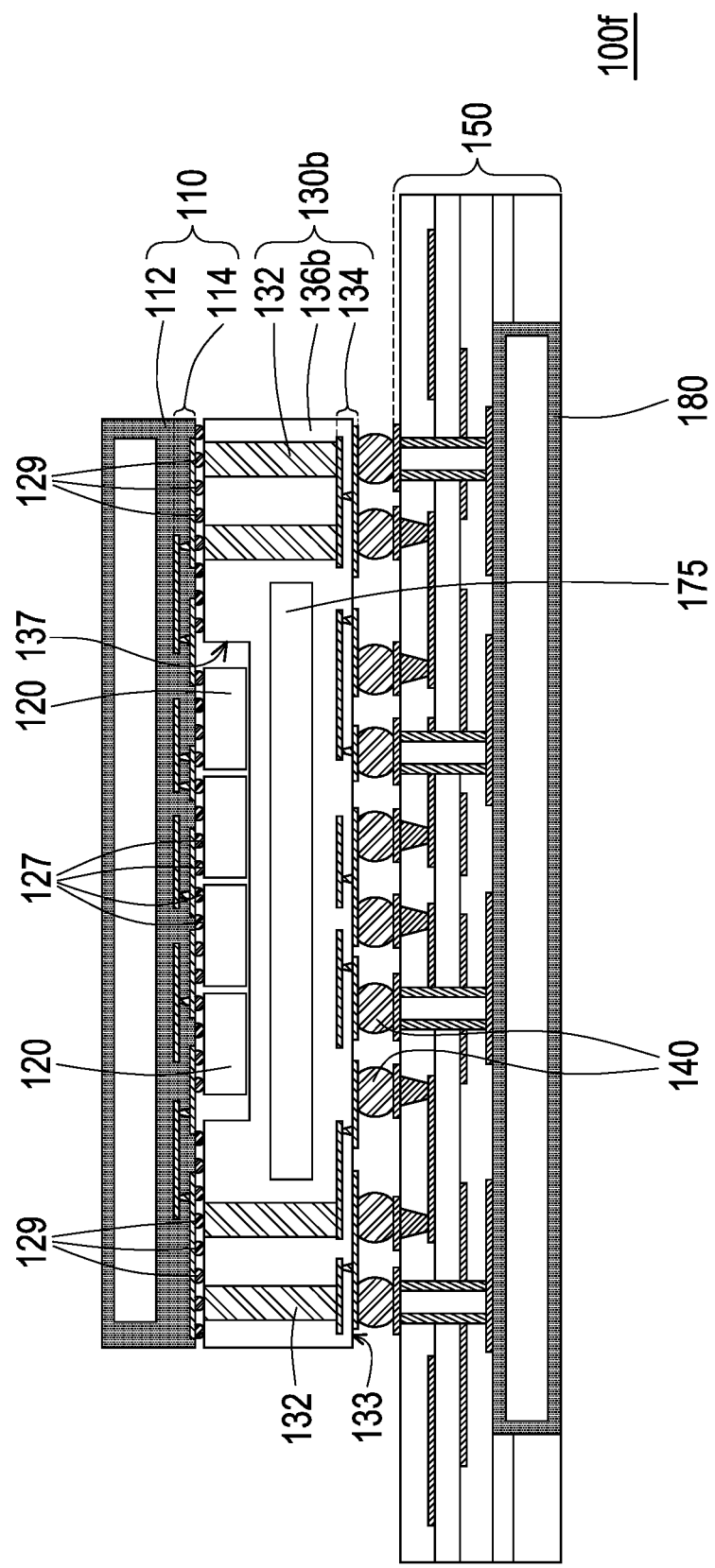
FIG. 10 is a schematic cross-sectional view of a heterogeneous integration semiconductor package structure according to another embodiment of the disclosure.

FIG. 10 is a schematic cross-sectional view of a heterogeneous integration semiconductor package structure according to another embodiment of the disclosure. Referring to FIG. 8 and FIG. 10 at the same time, a heterogeneous integration semiconductor package structure 100f of the embodiment is similar to the heterogeneous integration semiconductor package structure 100e of FIG. 8, and a difference there between is that in the embodiment, the heterogeneous integration semiconductor package structure 100f further includes a heat conduction assembly 180 embedded in the circuit substrate 150. The heat conduction assembly 180 is, for example, a vapor chamber, a pulsating heat pipe, a loop heat pipe, or a liquid-cooled micro flow channel.

Since the heterogeneous integration semiconductor package structure 100f of the embodiment is provided with the heat conduction device 175 in the package assembly 130b and provided with the heat conduction assembly 180 in the circuit substrate 150, the efficient temperature uniformity thermal diffusion mechanism may be used to effectively reduce the internal thermal resistance value of the heterogeneous integration semiconductor package structure 100f is reduced, thereby improving the heat dissipation effect of the heterogeneous integration semiconductor package structure 100f.

Figure 11:
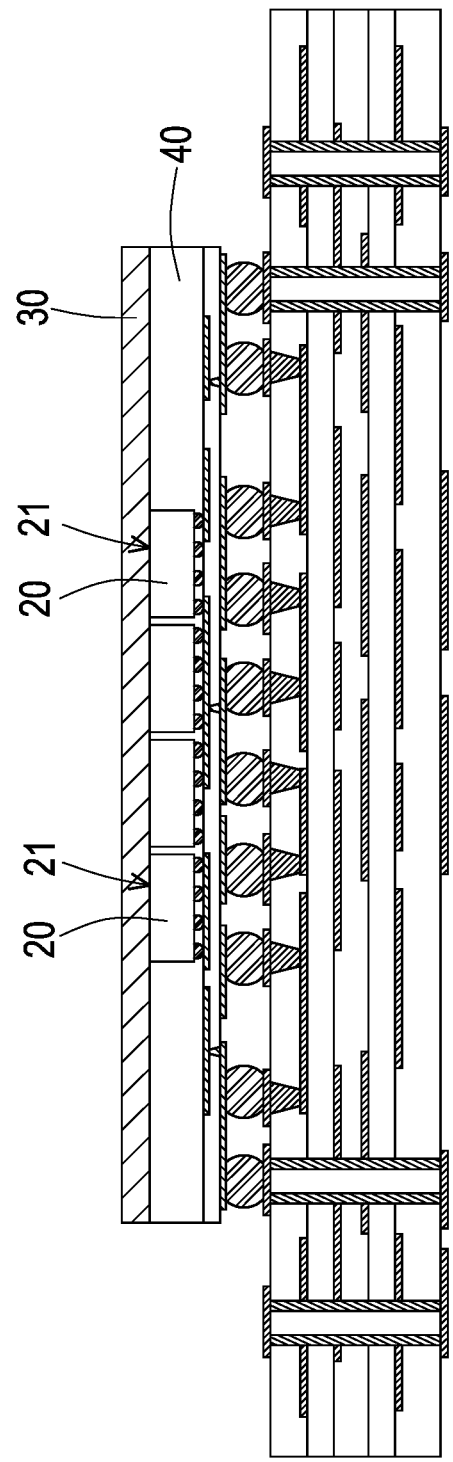
FIG. 11 is a schematic cross-sectional view of a heterogeneous integration semiconductor package structure of the prior art.

Referring to FIG. 5, FIG. 10 and FIG. 11 at the same time, in order to clearly illustrate the heterogeneous integration semiconductor package structure 100c in FIG. 5 and the heterogeneous integration semiconductor package structure 100f in FIG. The heterogeneous integration semiconductor package structure 10, ANSYS Icepak 17.2 is used for heat conduction simulation analysis. Boundary condition 1 of the simulation: h=1040 W/m$^2$K@area 8×8 cm$^2$ (simulating a typical air-cooled heat dissipation module), its Rca=0.15° C./W; boundary condition 2: h=100 W/m$^2$K@area 12×12 cm$^2$ (simulating typical airflow heat dissipation in casing). In each heterogeneous integration semiconductor package structure, there are four chips, and each produces heat of 100 W, with an area of 1×1 cm$^2$ and a thickness of 0.3 mm. The four chips are arranged in a 2×2 array, so that a total heating area is 2.1×2.1 cm$^2$, and a total heating value is 400 W.

Furthermore, in a heterogeneous integration semiconductor package structure 10 of the prior art of FIG. 11, back surfaces 21 of chips 20 are directly connected to a copper sheet 30, where a length and a width of the copper sheet 30 are the same as a size of a package body 40 of the heterogeneous integration semiconductor package structure 10, and the length, width and height of the copper sheet 30 are respectively 80 mm, 80 mm and 1.5 mm. The two-phase flow heat dissipation device 112 of the heterogeneous integration semiconductor package structure 100c in FIG. 5 is embodied as a silicon vapor chamber, and a length, a width, and a height thereof are respectively 80 mm, 80 mm, and 1.5 mm; the heat conduction device 170 is embodied as a copper sheet, and a length, a width, and a height thereof are respectively 46 mm, 46 mm, and 1.0 mm; and the heat conduction assembly 180 is embodied as a copper vapor chamber, and a length, a width, and a height thereof are respectively 90 mm, 90 mm, and 0.4 mm. The two-phase flow heat dissipation device 112 of the heterogeneous integration semiconductor package structure 100f in FIG. 10 is embodied as a silicon vapor chamber, and a length, a width, and a height thereof are respectively 80 mm, 80 mm, and 1.5 mm; the heat conduction device 175 is embodied as a silicon vapor chamber, and a length a width, and a height thereof are respectively 60 mm, 60 mm, and 0.6 mm; and the heat conduction assembly 180 is embodied as a copper vapor chamber, and a length, a width, and a height thereof are respectively 90 mm, 90 mm, and 0.4 mm.

Simulation results are as follows:

TABLE ONE

| Chip temperature | Heterogeneous integration semiconductor package structure 10 of the current state | Heterogeneous integration semiconductor package structure 100c | Heterogeneous integration semiconductor package structure 100f |
| --- | --- | --- | --- |
| Tmax | 161.5° C. | 87.0° C. | 82.5° C. |
| Tmin | 113.7° C. | 78.8° C. | 77.3° C. |
| Tavg | 144.0° C. | 84.2° C. | 80.8° C. |
| Temperature uniformity | 47.8° C. | 8.2° C. | 5.2° C. |

It is assumed that the maximum temperature of the chips 20, 120 should not exceed 100° C., the maximum allowable heat dissipation capacities of the heterogeneous integration semiconductor package structures 10, 100c, 100f are as follows:

TABLE TWO

| Chip temperature | Heterogeneous integration semiconductor package structure 10 of the current state | Heterogeneous integration semiconductor package structure 100c | Heterogeneous integration semiconductor package structure 100f |
| --- | --- | --- | --- |
| Tmax | 100.0° C. | 100.0° C. | 100° C. |
| Tmin | 73.0° C. | 90.2° C. | 93.4° C. |
| Tavg | 90.3° C. | 96.7° C. | 97.8° C. |
| Maximum allowable heat dissipation capacity P | 226.2 W (100%) | 477.7 W (211%) | 512.2 W (226%) |

From the above simulation results, it is known that the heterogeneous integration semiconductor package structure 100c and the heterogeneous integration semiconductor package structure 100f of the embodiments have the ability to increase performance by at least 50%, and have a better heat dissipation effect.

In summary, in the design of the heterogeneous integration semiconductor package structure of the disclosure, the chips are connected to the heat dissipation assembly with the two-phase flow heat dissipation device, so that the efficient temperature uniformity thermal diffusion mechanism may be used to improve the heat dissipation efficiency of the external heat dissipation module. In addition, the heat conduction device is provided in the package assembly and/or the heat conduction assembly is provided in the circuit substrate. Therefore, the efficient temperature uniformity thermal diffusion mechanism may be used to effectively reduce the internal thermal resistance of the heterogeneous integration semiconductor package structure, thereby improving the heat dissipation effect of the heterogeneous integration semiconductor package structure.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A heterogeneous integration semiconductor package structure, comprising:
    a heat dissipation assembly, having a connection surface, and comprising a two-phase flow heat dissipation device and a first redistribution structure layer embedded in the connection surface;
    a plurality of chips, disposed on the connection surface of the heat dissipation assembly and electrically connected to the first redistribution structure layer;
    a package assembly, disposed on the connection surface of the heat dissipation assembly and surrounding the chips, wherein the package assembly has an upper surface adjacent to the connection surface and a lower surface opposite to the upper surface and comprises a second redistribution structure layer disposed on the lower surface and a plurality of conductive vias electrically connected to the first redistribution structure layer and the second redistribution structure layer;
    a plurality of connectors, disposed on the package assembly, and electrically connected to the second redistribution structure layer;
    a circuit substrate, electrically connected to the second redistribution structure layer of the package assembly through the connectors;
    a plurality of solder balls, disposed between the chips and the first redistribution structure layer, wherein the chips are electrically connected to the first redistribution structure layer through the solder balls, wherein the package assembly further comprises a package component wrapping a periphery of the chips and a periphery of the conductive vias, connected to the first redistribution structure layer and the second redistribution structure layer, and filled between the solder balls and the chips;
    a plurality of heat conduction blocks, disposed on the connection surface of the heat dissipation assembly, surrounding the periphery of the chips and a periphery of the solder balls, and connected to the first redistribution structure layer; and
    a heat conduction device, in contact with the heat conduction blocks and the chips, wherein the chips and the heat conduction blocks are located between the heat conduction device and the heat dissipation assembly, and the package component further wraps a periphery of the heat conduction blocks and a periphery of the heat conduction device.

2. The heterogeneous integration semiconductor package structure as claimed in claim 1, wherein each of the chips has an active surface and a back surface opposite to each other, and the active surface faces the connection surface of the heat dissipation assembly.

3. The heterogeneous integration semiconductor package structure as claimed in claim 2, wherein there is a gap between the back surface of each of the chips and the second redistribution structure layer.

4. The heterogeneous integration semiconductor package structure as claimed in claim 1, wherein a material of the package component is a polymer material.

5. The heterogeneous integration semiconductor package structure as claimed in claim 1, wherein there is a gap between the heat conduction device and the second redistribution structure layer.

6. The heterogeneous integration semiconductor package structure as claimed in claim 1, wherein the heat conduction device comprises a silicon substrate, a graphite sheet, a metal plate, a vapor chamber, a pulsating heat pipe, or a loop heat pipe.

7. The heterogeneous integration semiconductor package structure as claimed in claim 1, further comprising:
    a heat conduction assembly, embedded in the circuit substrate.

8. The heterogeneous integration semiconductor package structure as claimed in claim 7, wherein the heat conduction assembly comprises a vapor chamber, a pulsating heat pipe, a loop heat pipe, or a liquid-cooled micro flow channel.

9. The heterogeneous integration semiconductor package structure as claimed in claim 1, wherein the two-phase flow heat dissipation device comprises a vapor chamber, a pulsating heat pipe, or a loop heat pipe.

10. The heterogeneous integration semiconductor package structure as claimed in claim 1, wherein the connectors comprise a plurality of solder balls.

11. The heterogeneous integration semiconductor package structure as claimed in claim 1, wherein an edge of the heat dissipation assembly is aligned with, slightly larger than, or smaller than an edge of the package assembly.

12. A heterogeneous integration semiconductor package structure, comprising:
    a heat dissipation assembly, having a connection surface, and comprising a two-phase flow heat dissipation device and a first redistribution structure layer embedded in the connection surface;
    a plurality of chips, disposed on the connection surface of the heat dissipation assembly and electrically connected to the first redistribution structure layer;
    a package assembly, disposed on the connection surface of the heat dissipation assembly and surrounding the chips, wherein the package assembly has an upper surface adjacent to the connection surface and a lower surface opposite to the upper surface and comprises a second redistribution structure layer disposed on the lower surface and a plurality of conductive vias electrically connected to the first redistribution structure layer and the second redistribution structure layer;
    a plurality of connectors, disposed on the package assembly, and electrically connected to the second redistribution structure layer; and
    a circuit substrate, electrically connected to the second redistribution structure layer of the package assembly through the connectors;

wherein the package assembly comprises a cover with a groove, the chips are located in the groove, the conductive vias and the second redistribution structure layer are embedded in the cover, and one end of each of the conductive vias and a surface of the second redistribution structure layer are exposed outside the cover; and wherein there is an air gap between the connection surface of the heat dissipation assembly and a bottom surface of the groove.

13. The heterogeneous integration semiconductor package structure as claimed in claim 12, wherein a material of the cover is silicon, and the conductive vias are a plurality of through silicon vias.

14. The heterogeneous integration semiconductor package structure as claimed in claim 12, further comprising:

a plurality of first solder balls, disposed between the chips and the first redistribution structure layer, wherein the chips are electrically connected to the first redistribution structure layer through the first solder balls; and a plurality of second solder balls, disposed between the upper surface of the package assembly and the first redistribution structure layer, wherein the conductive vias are electrically connected to the first redistribution structure layer through the second solder balls.

15. The heterogeneous integration semiconductor package structure as claimed in claim 12, further comprising:

a heat conduction device, embedded in the cover and disposed corresponding to the chips, wherein there is a gap between the heat conduction device and the chips, and the gap is used to be filled with a thermal interface material.

16. The heterogeneous integration semiconductor package structure as claimed in claim 15, wherein the heat conduction device comprises a vapor chamber, a pulsating heat pipe, or a loop heat pipe.

* * * * *